US008860192B2

(12) United States Patent
Stella

(10) Patent No.: US 8,860,192 B2
(45) Date of Patent: *Oct. 14, 2014

(54) POWER DEVICE HAVING HIGH SWITCHING SPEED

(75) Inventor: Cristiano Gianluca Stella, San Gregorio di Catania (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

This patent is subject to a terminal disclaimer.

(21) Appl. No.: 13/534,832

(22) Filed: Jun. 27, 2012

(65) Prior Publication Data

US 2013/0001763 A1   Jan. 3, 2013

(30) Foreign Application Priority Data

Jun. 30, 2011   (IT) ................. MI2011A1218

(51) Int. Cl.
*H01L 23/495* (2006.01)
*H01L 23/433* (2006.01)
*H01L 23/00* (2006.01)

(52) U.S. Cl.
CPC .... *H01L 23/49562* (2013.01); *H01L 23/49568* (2013.01); *H01L 23/4334* (2013.01); *H01L 24/32* (2013.01); *H01L 2924/13055* (2013.01); *H01L 2924/13091* (2013.01)
USPC ............. 257/675; 257/707; 257/E23.051

(58) Field of Classification Search
CPC ............. H01L 23/49562; H01L 23/49568; H01L 23/4334
USPC ............. 257/675, 707, E23.044, E23.051
See application file for complete search history.

(56) References Cited

U.S. PATENT DOCUMENTS

| 4,147,889 A | 4/1979 | Andrews et al. |
| 4,611,238 A | 9/1986 | Lewis et al. |
| 4,748,538 A | 5/1988 | Tsuji |
| 4,918,571 A | 4/1990 | Grabbe |
| 5,311,395 A | 5/1994 | McGaha et al. |

(Continued)

FOREIGN PATENT DOCUMENTS

| EP | 0812015 A1 | 12/1997 |
| EP | 0948047 A2 | 10/1999 |

(Continued)

OTHER PUBLICATIONS

Definition of cavity. Dictionary.com.*

(Continued)

*Primary Examiner* — Yu Chen
(74) *Attorney, Agent, or Firm* — Gardere Wynne Sewell LLP

(57) ABSTRACT

An electronic device includes at least one electronic component chip having a first conduction terminal and a control terminal on a first surface of the chip and a second conduction terminal on a second surface opposite the first surface of the chip. An insulating body embeds the chip. The insulating body includes a mounting surface and an electrically conductive heat-sink connected to the first conduction terminal on the first surface of the chip, but insulated from the control terminal. An opening in a first surface of the insulating body exposes a surface of the electrically conductive heat sink. The electrically conductive heat sink includes a perimeter cavity configured for alignment with an encircling configuration of the control terminal, wherein the perimeter cavity contains a material that insulates the control terminal from the heat sink.

18 Claims, 8 Drawing Sheets

(56) References Cited

U.S. PATENT DOCUMENTS

| | | |
|---|---|---|
| 5,504,652 A | 4/1996 | Foster et al. |
| 5,977,630 A | 11/1999 | Woodworth et al. |
| 6,054,759 A | 4/2000 | Nakamura |
| 6,150,254 A | 11/2000 | Kito |
| 6,707,676 B1 | 3/2004 | Geva et al. |
| 6,833,997 B1 | 12/2004 | Jones, III et al. |
| 7,145,224 B2 | 12/2006 | Kawashima et al. |
| 7,286,361 B2 | 10/2007 | Yamanaka |
| 7,746,650 B2 | 6/2010 | Hellinger et al. |
| 7,776,658 B2 | 8/2010 | Liu et al. |
| 7,816,784 B2 | 10/2010 | Son et al. |
| 7,851,908 B2 | 12/2010 | Otremba et al. |
| 7,892,893 B2 | 2/2011 | Obara |
| 8,062,932 B2 | 11/2011 | Hebert et al. |
| 8,154,108 B2 | 4/2012 | Liu et al. |
| 8,358,017 B2 | 1/2013 | Tsui |
| 8,390,041 B2 | 3/2013 | Yoshimochi |
| 8,481,368 B2 | 7/2013 | Xue et al. |
| 8,604,611 B2 | 12/2013 | Hauenstein |
| 2005/0161785 A1 | 7/2005 | Kawashima et al. |
| 2005/0280140 A1 | 12/2005 | Corbin et al. |
| 2006/0091512 A1 | 5/2006 | Shinohara |
| 2007/0090523 A1 | 4/2007 | Otremba |
| 2007/0108564 A1 | 5/2007 | Tang et al. |
| 2007/0215996 A1* | 9/2007 | Otremba .................. 257/678 |
| 2008/0054422 A1 | 3/2008 | Koike et al. |
| 2009/0236732 A1 | 9/2009 | Yu et al. |
| 2009/0323288 A1 | 12/2009 | Bernard |
| 2010/0133674 A1 | 6/2010 | Hebert et al. |
| 2011/0096509 A1 | 4/2011 | Yoshimochi |
| 2013/0003305 A1 | 1/2013 | Stella |
| 2013/0003308 A1 | 1/2013 | Stella |
| 2013/0003311 A1 | 1/2013 | Privitera et al. |
| 2013/0003312 A1 | 1/2013 | Stella et al. |

FOREIGN PATENT DOCUMENTS

| | | |
|---|---|---|
| JP | 58218149 A | 12/1983 |
| JP | 62104056 A | 5/1987 |
| JP | 4368155 A | 12/1992 |
| JP | 6037217 A | 2/1994 |
| JP | 8078584 A | 3/1996 |
| WO | WO-2006058030 A2 | 6/2006 |

OTHER PUBLICATIONS

Definition of channel. Dictionary.com.*

Definition of cavity and channel., Dictionary.com., downloaded Jul. 8, 2014.*

* cited by examiner

POWER DEVICE HAVING HIGH SWITCHING SPEED

PRIORITY CLAIM

This application claims priority from Italian Application for Patent No. MI2011A001218 filed Jun. 30, 2011, the disclosure of which is incorporated by reference.

TECHNICAL FIELD

The solution according to one or more embodiments of the present invention relates to the electronics field. More specifically, such solution relates to electronic devices for power applications (e.g., motor control and power supplies), or power devices.

BACKGROUND

Each power device typically comprises a chip of semiconductor material, on which one or more power components (e.g., power transistors—such as vertical structure MOS power transistors) are integrated, and a package wherein the chip is encapsulated for protecting it and allowing access to terminals thereof.

More particularly, each power component usually comprises a collection terminal (for example, a drain terminal of the power transistor) extending on a lower surface of the chip (that typically, in use, is orientated towards a support, such as a printed circuit board—or PCB—on which the power device is mounted), a source terminal (e.g., a source terminal of the power transistor) extending on an upper surface of the chip (typically opposite the lower surface), and a control terminal (for example, a gate terminal of the power transistor) extending on the upper surface of the chip too, typically surrounding the source terminal.

The package typically comprises an insulating body having contacts (or leads) that allows connecting the power device to external circuits. Each lead is electrically connected to a corresponding terminal of the chip; in particular, according to a typical implementation, the package comprises source leads (e.g., three) connected to the source terminal of the power transistor, a drain lead connected to the drain terminal and a gate lead connected to the gate terminal.

The power devices have limitations that preclude use thereof in some applications. As it is known, such limitations are substantially related to the presence of parasitism affecting a driving of the power transistor.

In particular, since the leads (as well as the terminals and other conductive elements—for example, heat-sinks) have to meet specific safety parameters of the power device (for example, surface distances—"creepage" distances—and/or air distances—"clearance" distances), they have specific shape and/or size and are appropriately spaced apart from each other. For this reason, typically the source, drain and gate leads at least partially face on, or in correspondence of, a same surface of the insulating body that in use is oriented towards the PCB (or mounting surface). This involves that the source terminal of the power transistor (on the upper surface of the chip) is connected to the corresponding source leads (on the mounting surface of the package) through a relatively long conductive path that defines a parasitic inductor.

In some operating conditions, such a parasitic inductor may cause long switching times to the power device, and hence high switching losses.

For example, this may happen when switching from a turning-on condition of the power transistor (condition wherein the power transistor, having the gate terminal at a higher voltage than the source terminal by at least one threshold voltage, i.e. overdrive voltage greater than zero, is crossed by a high current) to a turning-off condition (overdrive voltage lower than or equal to zero). In this case, in fact, a decrease of the voltage at the gate terminal causes a decrease of the current in the power transistor. The source terminal, for effect of the parasitic inductor and because of such current decrease, is initially subjected to a greater voltage decrease with respect to the source lead (thereby settling then to the voltage value of the latter); therefore, the overdrive voltage zeroes after a certain delay (depending on a transient time required by the parasitic inductor to settle the voltage at the source terminal to that of the source terminal), thereby causing a corresponding delay in the turning-off of the power transistor.

SUMMARY

In its general terms, the solution according to one or more embodiments is based on the idea of reversing the chip.

In particular, one or more aspects of the solution according to specific embodiments are set out in the independent claims, with advantageous features of the same solution that are indicated in the dependent claims, whose wording is enclosed herein verbatim by reference (with any advantageous feature provided with reference to a specific aspect of the solution according to an embodiment that applies mutatis mutandis to any other aspect thereof).

More specifically, an aspect of the solution according to an embodiment proposes an electronic device (for example, an electronic device for power applications). The electronic device comprises at least one chip in which at least one electronic component is integrated (for example, a vertical structure MOS power transistor); said chip comprises a first conduction terminal (for example, a source terminal of the power transistor) and a control terminal (for example, a gate terminal of the power transistor) on a first surface of the chip for a driving of the electronic device, and a second conduction terminal (for example, a drain terminal of the power transistor) on a second surface opposite the first surface of the chip. The electronic device further comprises an insulating body embedding said at least one chip, the insulating body having a mounting surface for mounting on a board, an electrically conductive heat-sink connected to said at least one chip for dissipating the heat generated by said at least one electronic component towards the mounting surface, and at least one first conduction lead of the electronic device at the mounting surface and directly electrically connected to the heat-sink. In the solution according to one or more embodiments, the first surface of the chip faces the heat-sink; the first conduction terminal is electrically connected to the heat-sink and the control terminal is electrically insulated from the heat-sink.

Another aspect of the solution according to an embodiment proposes a complex system comprising one or more of such electronic devices.

A further aspect of the solution according to an embodiment proposes a method for making the electronic device.

BRIEF DESCRIPTION OF THE DRAWINGS

The solution according to one or more embodiments, as well as further features and the advantages thereof, will be best understood with reference to the following detailed description, given purely by way of a non-restrictive indication, to be read in conjunction with the accompanying drawings (wherein corresponding elements are denoted with equal or similar references, and their explanation is not repeated for the sake of exposition brevity). In this respect, it is expressly understood that the figures are not necessarily drawn to scale (with some details that may be exaggerated and/or simplified) and that, unless otherwise indicated, they are simply used to conceptually illustrate the described structures and procedures. In particular.

DETAILED DESCRIPTION OF THE DRAWINGS

Figure 1A:
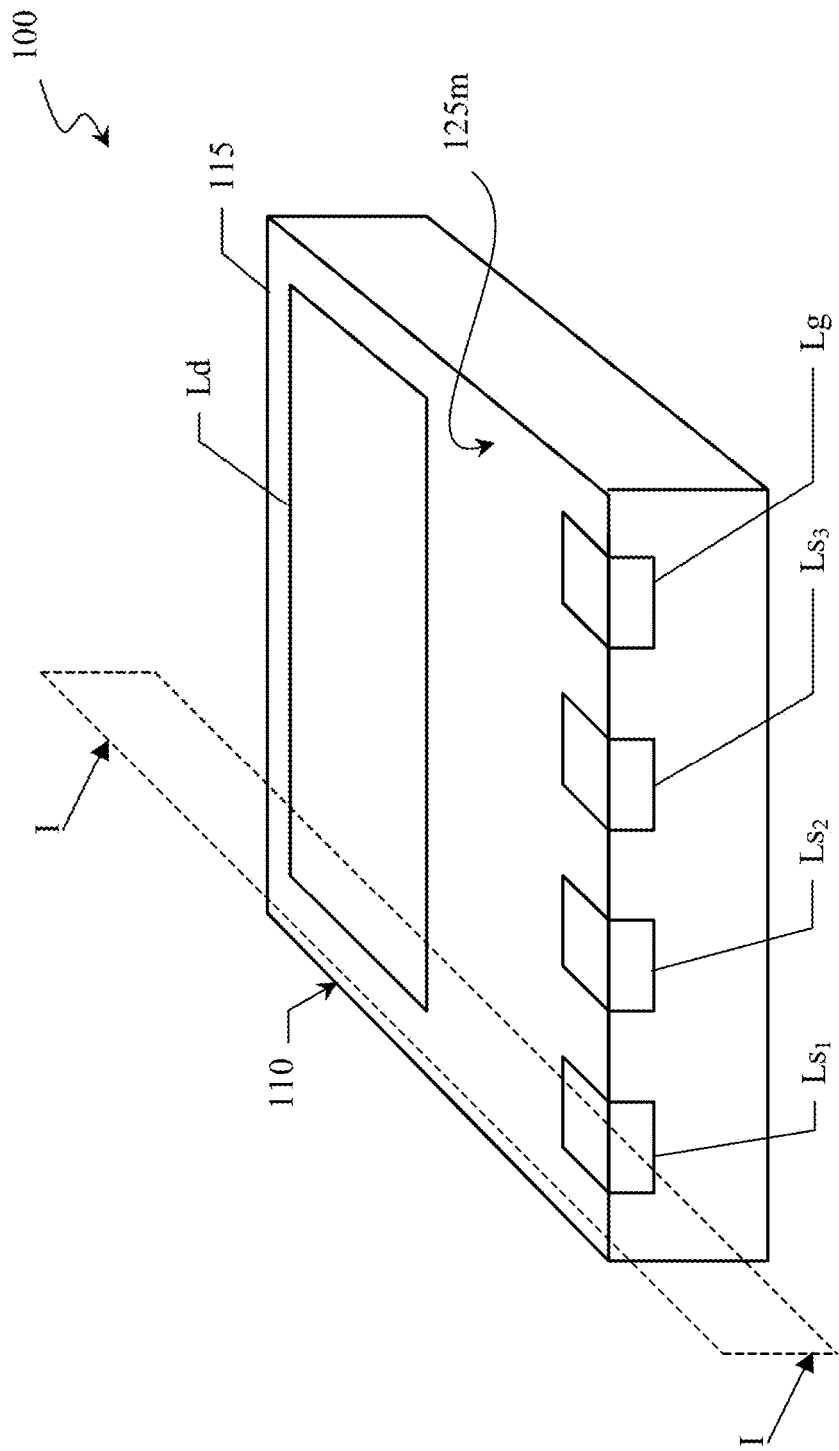
FIG. 1A shows a perspective representation of a known electronic device.

With particular reference to FIG. 1A, there is shown a perspective representation of an electronic device 100 (reversed with respect to a mounting direction thereof on, for example a PCB, not shown). For the sake of description simplicity, such figure will be discussed jointly with FIG. 1B, which shows a sectional view of the electronic device 100 along the plane I-I of FIG. 1A.

The electronic device 100 may comprise one or a plurality of chips of semiconductor material, in each of which one or more electronic components may be integrated, and a package for embedding the one or more chips.

In the exemplary but non limiting described embodiment, the electronic device 100 is an electronic device for power applications (for example, for controlling motors and power suppliers) or power device, and comprises a single chip 105 on which a single power component is integrated (e.g., a vertical structure MOS power transistor) having operating voltages between 5.5V and 1000V).

Figure 1B:
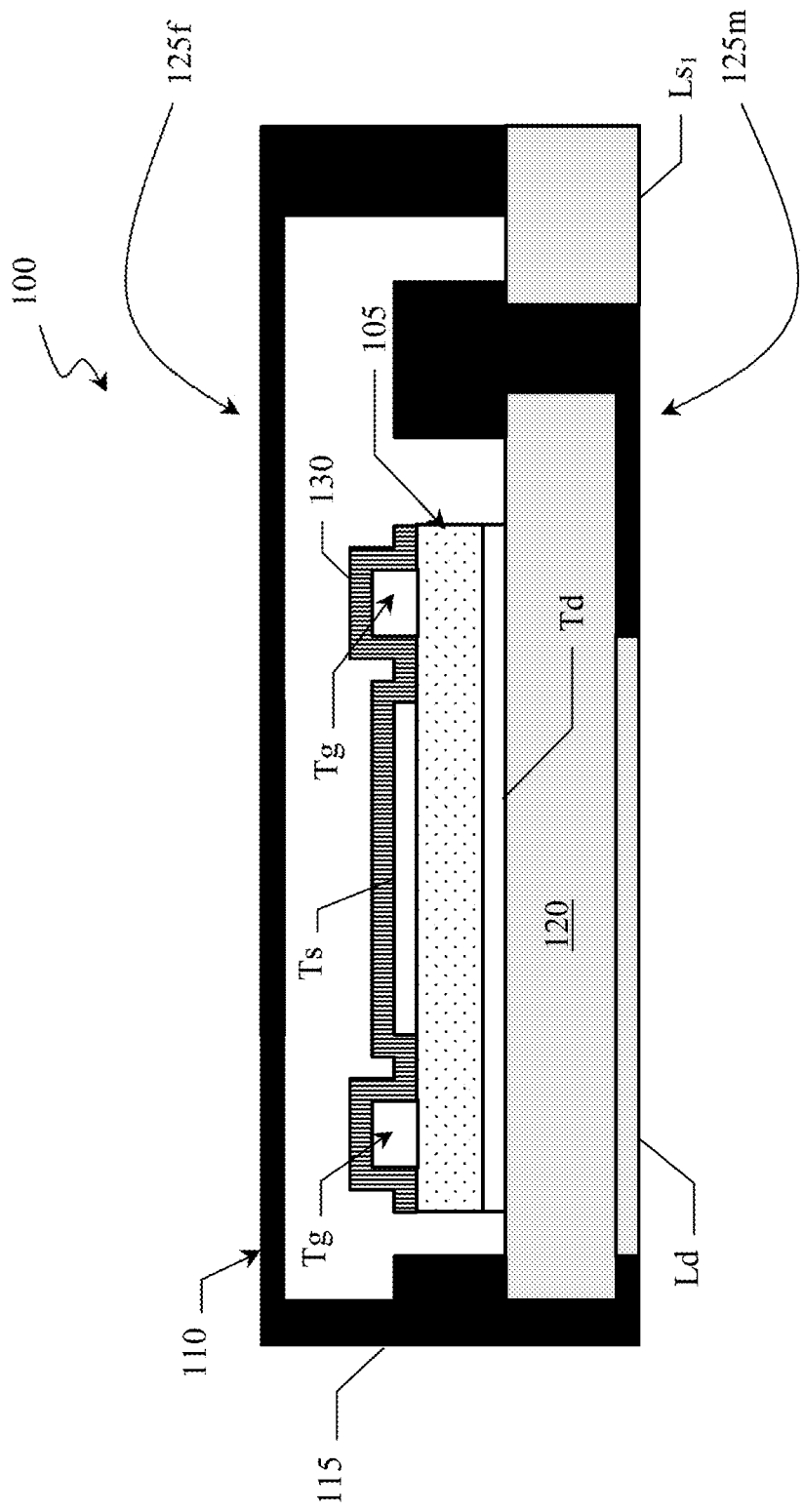
FIG. 1B shows a sectional view of the electronic device of FIG. 1A along the plane I-I.

As best visible in FIG. 1B, the power device 100 comprises a package 110, for example of the "Fully-Molded" type. In particular, the package 110 comprises a generally parallelepiped-shaped insulating body (e.g., of plastic material) 115, which embeds the chip 105; the package 110 also comprises a heat-sink 120 (or lower heat-sink—in the shown example, a solid plate of conductive material), for dissipating the heat generated by the chip 105 towards a mounting surface 125$m$ of the insulating body 115 (for mounting the power device 100 on the PCB).

The chip 105 has a conduction terminal Td (for example, a drain terminal of the power transistor) extending on a surface of the chip 105 facing towards the heat-sink 120, another conduction terminal Ts (for example, a source terminal of the power transistor) extending on a surface of the chip 105 facing towards a free surface 125$f$ of the insulating body 115 opposite the mounting surface 125$m$, and a control terminal Tg (for example, a gate terminal of the transistor power), which, in general, extends on the surface of the chip 105 facing towards the surface 125$f$ too, substantially surrounding the terminal Ts.

More specifically, as it is known, the terminal Tg comprises, on the surface of the chip 105 facing towards the surface 125$f$, a frame arranged at the edges of such surface (partially visible in FIG. 1B), and a connection pad (not shown) enlarging from such frame inwards at the side of the chip facing towards the leads $Ls_1$, $Ls_2$, $Ls_3$, Lg.

The terminals Tg and Ts are insulated from each other by means of a passivation layer 130; moreover, the passivation layer 130, covering (typically partially, leaving conductive regions thereof free) the terminal Ts (and usually, although not shown, also other regions of the chip 105), avoids corrosion phenomena thereof (for example, oxidation reactions) and ensures an adequate mechanical protection.

Although not shown in the figure, as it is known, intermediate layers may be provided between the heat-sink 120 and the terminal Td (for example, coupling layers and/or soldering layers) in order to ensure good adhesion properties (and hence efficient mechanical and/or electric coupling) between them.

The package 110 comprises a plurality of contacts or leads (five, in the illustrative shown embodiment) $Ls_1$, $Ls_2$, $Ls_3$, Ld and Lg, which are connected to respective terminals of the chip 105 (for making the latter accessible from the outside of the power device 100) and are suitable to allow the mounting of the power device 100 on the PCB through surface mounting technology (or SMT).

In general, properties such as shape, size and/or arrangement of the leads $Ls_1$, $Ls_2$, $Ls_3$, Ld and Lg should meet specific safety parameters of the power device, such as "creepage" distance (minimum distance on the surface of the insulating body between conductive elements—for example the leads $Ls_1$, $Ls_2$, $Ls_3$, Ld, Lg, the heat-sink 120 and the terminal Td, Ts, Tg) and/or "clearance" distance (minimum air distance between the conductive elements).

In particular, the lead Ld comprises a generally rectangular-shaped pad of metal material extending on about one third of the mounting surface 125$m$ of the insulating body 115; such pad is connected to the heat-sink 120, and hence to the terminal Td, so as to act both as lead for accessing the terminal Td and as heat dissipation surface.

The leads $Ls_1$, $Ls_2$, $Ls_3$ and Lg, evenly arranged along an edge of the mounting surface 125$m$ opposite the lead Ld, are instead formed each one by a generally square-shaped exposed pad of metal material that extends partly on the mounting surface 125$m$ and partly on an adjacent side surface of the insulating body 115 (with the leads $Ls_1$, $Ls_2$, $Ls_3$ that, in a typical implementation, are directly connected to each other within the package 110); the leads $Ls_1$, $Ls_2$, $Ls_3$ contact a free region of the terminal Ts not covered by the passivation layer 130 (not visible in the figure) through wire bonding (not visible), whereas the lead Lg contacts a free region of the terminal Tg not covered by the passivation layer 130 (not visible in the figure) through a similar wire bonding (not visible).

As mentioned in the introductory part of the present document, the power device 100 has parasitism that affect a driving of the same. In particular, the connection between the terminal Ts and the leads $Ls_1$, $Ls_2$, $Ls_3$ of the package 110 forms a relatively long conductive path that defines a parasitic inductor.

Such parasitic inductor may cause long switching times to the power device 100, and hence high switching losses, such as in the case of switching from a turning-on condition thereof (wherein the power transistor, having an overdrive voltage greater than zero, is crossed by a high current) to a turning-off condition (overdrive voltage lower than or equal to zero). In such case, a decrease of the voltage at the terminal Tg (for turning-off the power transistor) causes in general a decrease of the current in the power transistor, and hence in the parasitic inductor, (i.e., between the terminal Ts and the leads $Ls_1$, $Ls_2$, $Ls_3$).

More particularly, because of current decrease in the power transistor, and hence in the parasitic indictor, the latter is subjected to a voltage change across it depending on inductance value thereof and on the magnitude of such current decrease; therefore, the terminal Ts is initially brought to a voltage lower than the that at the leads $Ls_1$, $Ls_2$, $Ls_3$ by an amount equal to such voltage change. In this way, the overdrive voltage zeroes after a certain delay (depending on a transient time required by the parasitic inductor for settling the voltage at the terminal Ts to the voltage at the leads $Ls_1$, $Ls_2$, $Ls_3$), thereby causing a corresponding delay in the turning-off of the power transistor. In general, this involves that the electronic device 100 has a relatively low switching speed.

Figure 2A:
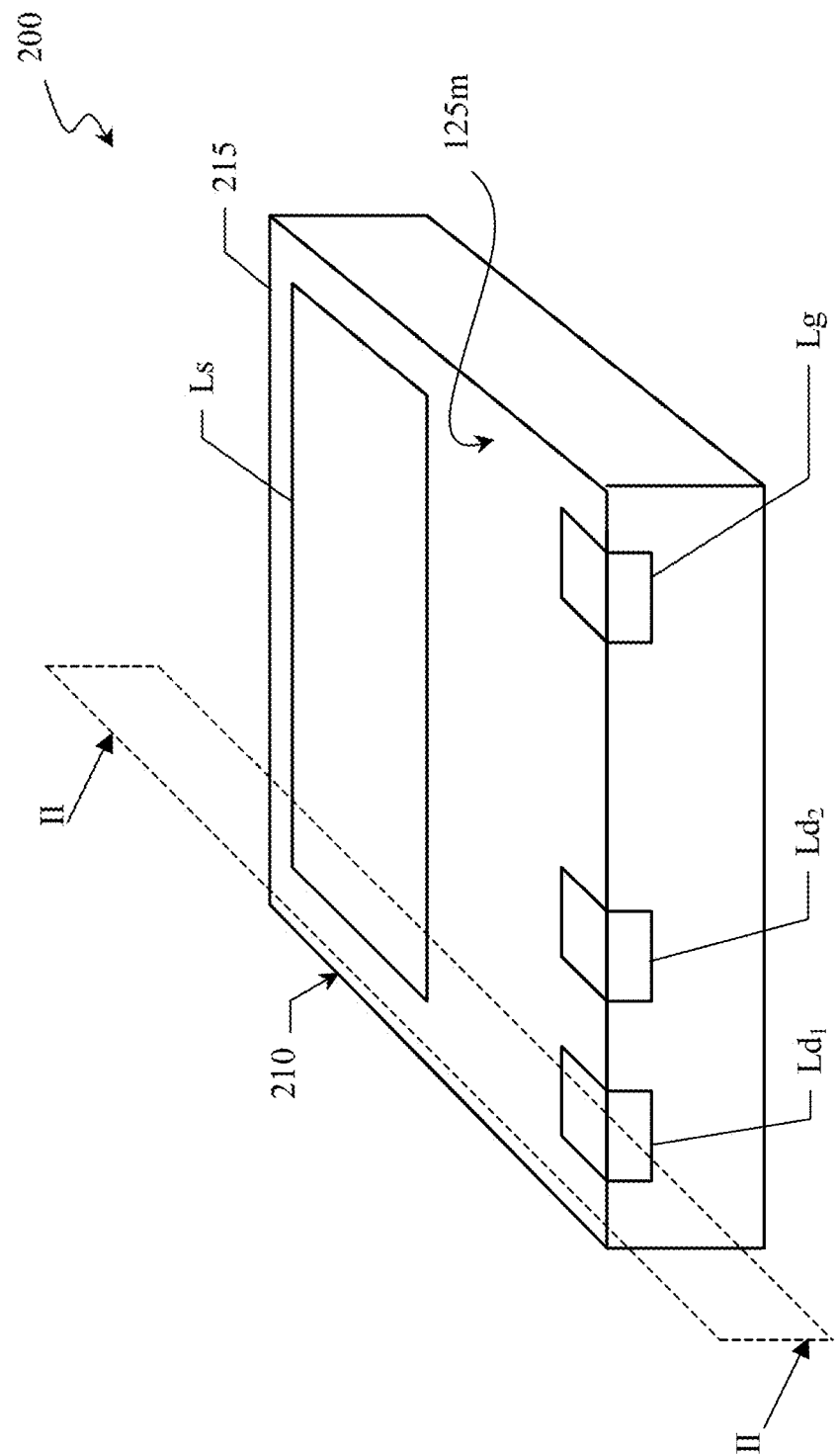
FIG. 2A shows a perspective representation of an electronic device according to an embodiment.

Turning to FIG. 2A, it shows a perspective representation of an electronic device 200 (e.g., still a power device shown reversed with respect to a mounting direction thereof) according to an embodiment. As before, for the sake of description simplicity, such figure will be discussed jointly with FIG. 2B, which shows a sectional view of the electronic device 200 along the plane II-II of FIG. 2A.

The power device 200 comprises a chip 205 and a package 210 for embedding the latter.

Figure 2B:
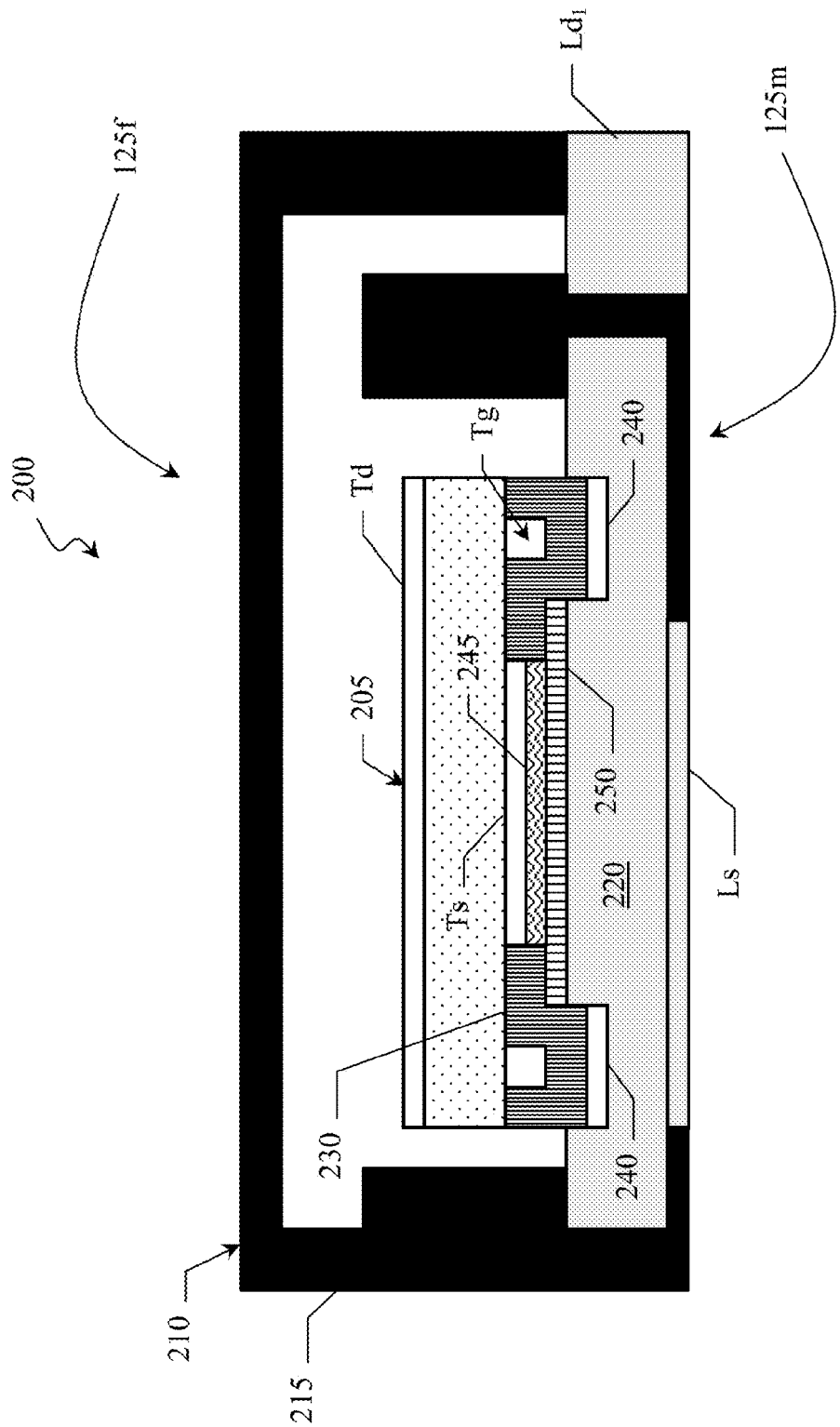
FIG. 2B shows a sectional view of the electronic device of FIG. 2A along the plane II-II.

As best visible in FIG. 2B, the chip 205 is structurally similar to the previous one, but it is mounted within the insulating body 215 of the package 210 reversed with respect to the case of FIGS. 1A and 1B (i.e., it is installed upsidedown). Therefore, the terminals Td, Ts and Tg are in reversed configuration, with the terminals Ts and Tg that now face towards the heat-sink 220, whereas the terminal Td faces towards the surface 125f. This involves a different configuration of the leads; in particular, the power device 200 comprises the lead Lg, which, as before, is connected to the terminal Tg, a source lead Ls that, as above for the lead Ld, is directly connected to the heat-sink 220, and hence to the lower terminal of the chip 205 (in this case the terminal Ts), and two drain leads $Ld_1$ and $Ld_2$ that, as before for the leads $Ls_1$, $Ls_2$ and $Ls_3$ are connected to the upper terminal of the chip (in this case the terminal Td). It should be noted that, due to the reversing of the chip, the leads may be subject to a reconfiguration with respect to the previous case; preferably, although not necessarily, the leads $Ld_1$ and $Ld_2$ are only two (instead of three, as in the case of the leads $Ls_1$, $Ls_2$ and $Ls_3$), in order to meet the constraint of the creepage distance (e.g., equal to 3 mm) between them and the lead Lg.

As before, the exposed conductive pad connected to the heat-sink 220 may act both as lead Ls for accessing the terminal Ts and as heat dissipation surface.

The heat-sink 220 has a structure that allows the chip 205, in reversed configuration, to be easily placed and contacted. In particular, as best visible in FIG. 2C, which shows a perspective view of only the heat-sink 220 in its simplest implementation, the heat-sink 220 comprises, on the surface that in the use faces the chip 205, a perimeter cavity 240 adapted to properly align the chip 205, for example at the perimeter frame of the terminal Tg (as shown in FIG. 2B), and a recess 240r to accommodate the pad of the terminal Tg and allow a linking (e.g., through wire bonding, not shown) between the latter and the lead Lg.

Referring again to FIG. 2B, as before, the power device 200 comprises a passivation layer 230, which covers the terminal Tg (for insulating it from the terminal Ts), but not the terminal Ts (which should be free for electrically contacting the heat-sink 220).

In this respect, the power device 200 further comprises a coupling layer of metal layer 245 (e.g., titanium, nickel, gold, or a combination thereof) and a soldering layer 250 of conductive material (e.g., tin, lead, silver, or a combination thereof) in order to allow an optimal fixing of the terminal Ts (that is usually of a material having low adhesion properties, such as aluminum) on the heat-sink 220.

The described solution is advantageous since between the source lead and the source terminal a conductive path having reduced length is provided that defines a mainly resistive (instead of inductive) coupling. In this way, the power device described above can be driven in an easy and reliable way, without that, during a switching, unwanted changes of the overdrive voltage occur; this allows obtaining extremely short switching times (and hence very low switching losses) with respect to the power devices currently marketed.

It should also be noted that such result has been obtained easily and without making, in principle, substantial changes to the known power device and to the production process thereof. In this respect, it should be noted that elements that are not strictly related to the embodiments (some of which have been deliberately omitted here for the sake of simplicity) may arbitrarily be changed in order to meet certain parameters of the power device and/or obtain predefined operating features of the same. This is the case, for example, of the different configuration of the leads herein described, suggested in the present description as a simple implementation possibility intended to meet the safety parameters (for example, creepage distance).

Figure 3:
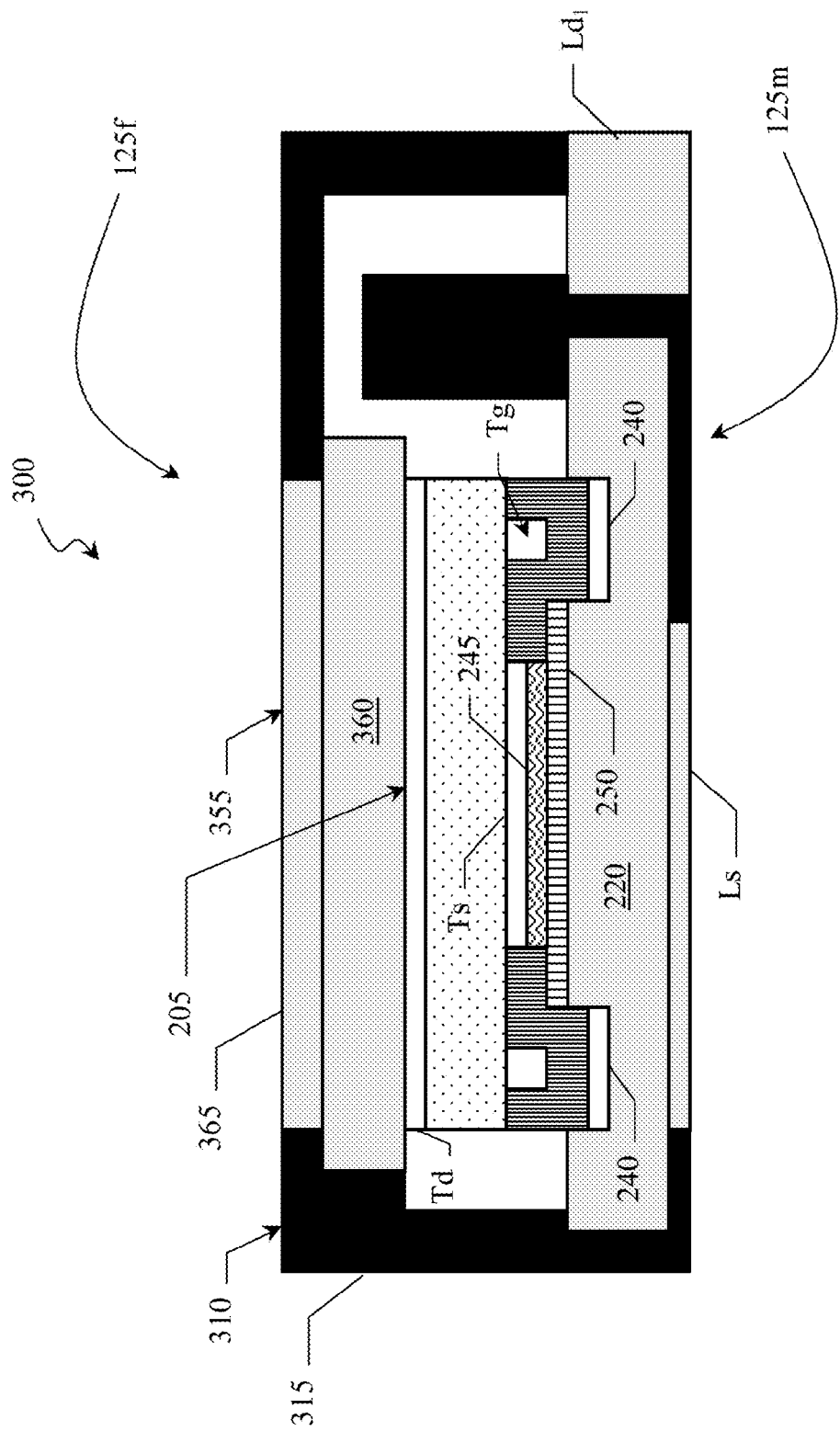
FIG. 3 shows a sectional view of an electronic device according to another embodiment.

Turning now to FIG. 3, there is shown a sectional view (similar to the previous one) of an electronic device 300 (e.g., still a power device) according to another embodiment.

The power device 300 comprises, as before, the chip 205 and a package 310 for embedding the latter. As visible in the figure, the package 310 is of the DSC ("Dual Cool Side") type. In particular, the package 310 comprises an insulating body of plastic material 315 (that embeds the chip 205) similar to the insulating body 215; in addition with respect to the latter, the package 310 comprises a further heat-sink 355 (or upper heat-sink) for dissipating the heat generated by the chip 205 towards the free surface 125f of the insulating body 315.

As visible in the figure, the heat-sink 355 contacts the terminal Td. More specifically, the heat-sink 355 comprises a plate 360 of conductive material that contacts the terminal Td (preferably, though not necessarily, through a further layer of metal material and a further soldering layer, not shown for the sake of simplicity, similar to the layers 245 and 250, respectively), and an exposed pad 365 (in contact with the plate 360); such pad 365, despite being electrically coupled to the terminal Td, is usually used only as a further heat dissipation surface or as support surface on which an auxiliary heat-sink (not shown) may be possibly mounted (for example, by gluing).

Figure 2C:
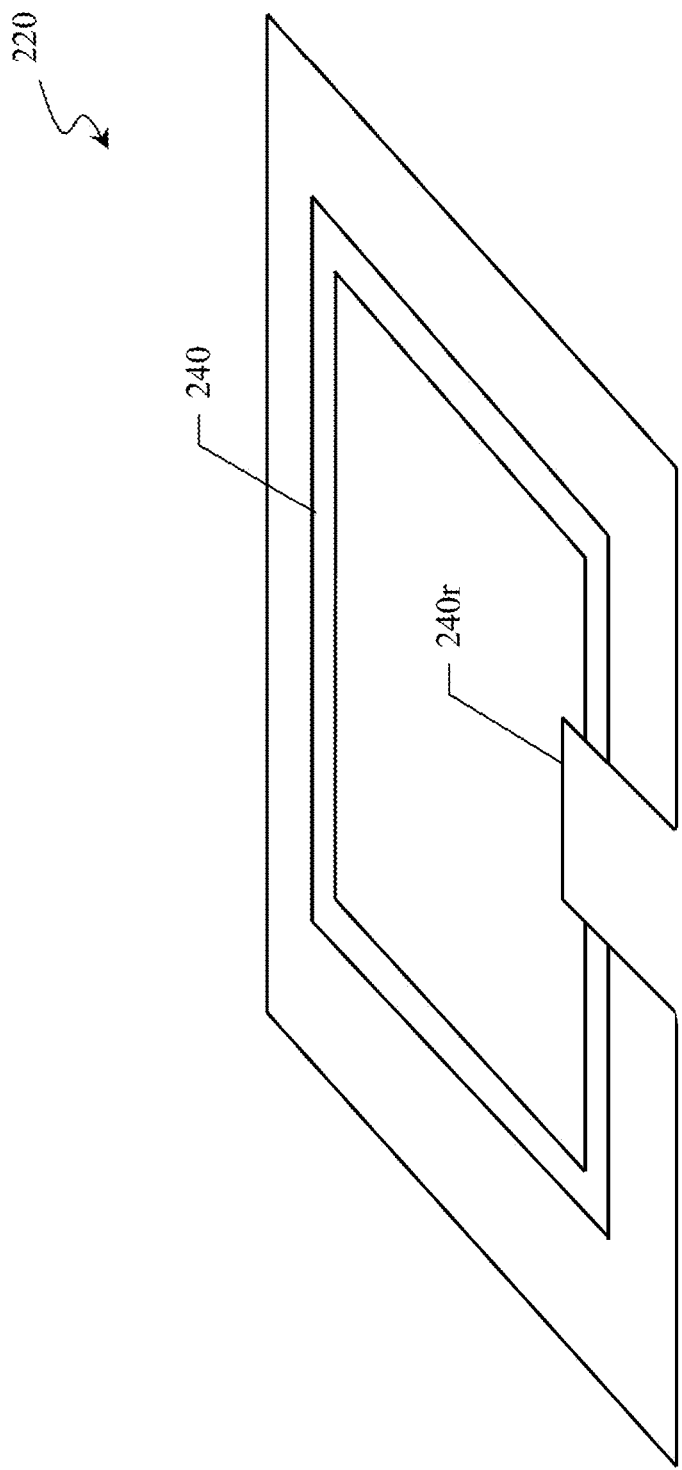
FIG. 2C shows a perspective view of a part of the electronic device of FIG. 2A according to an embodiment.

The power device 300 has the further advantage with respect to the previous one of FIGS. 2A-2C to provide a better heat dissipation. In fact, since the power transistors are affected by high voltages and currents, they are subject to considerable heat during operation thereof. The presence of the heat-sink 355, in addition to the heat-sink 220, ensures adequate heat dissipation properties to the package 310 (so as to avoid the overheating phenomena to the chip 205 that could cause malfunction or breakage).

Figure 4:
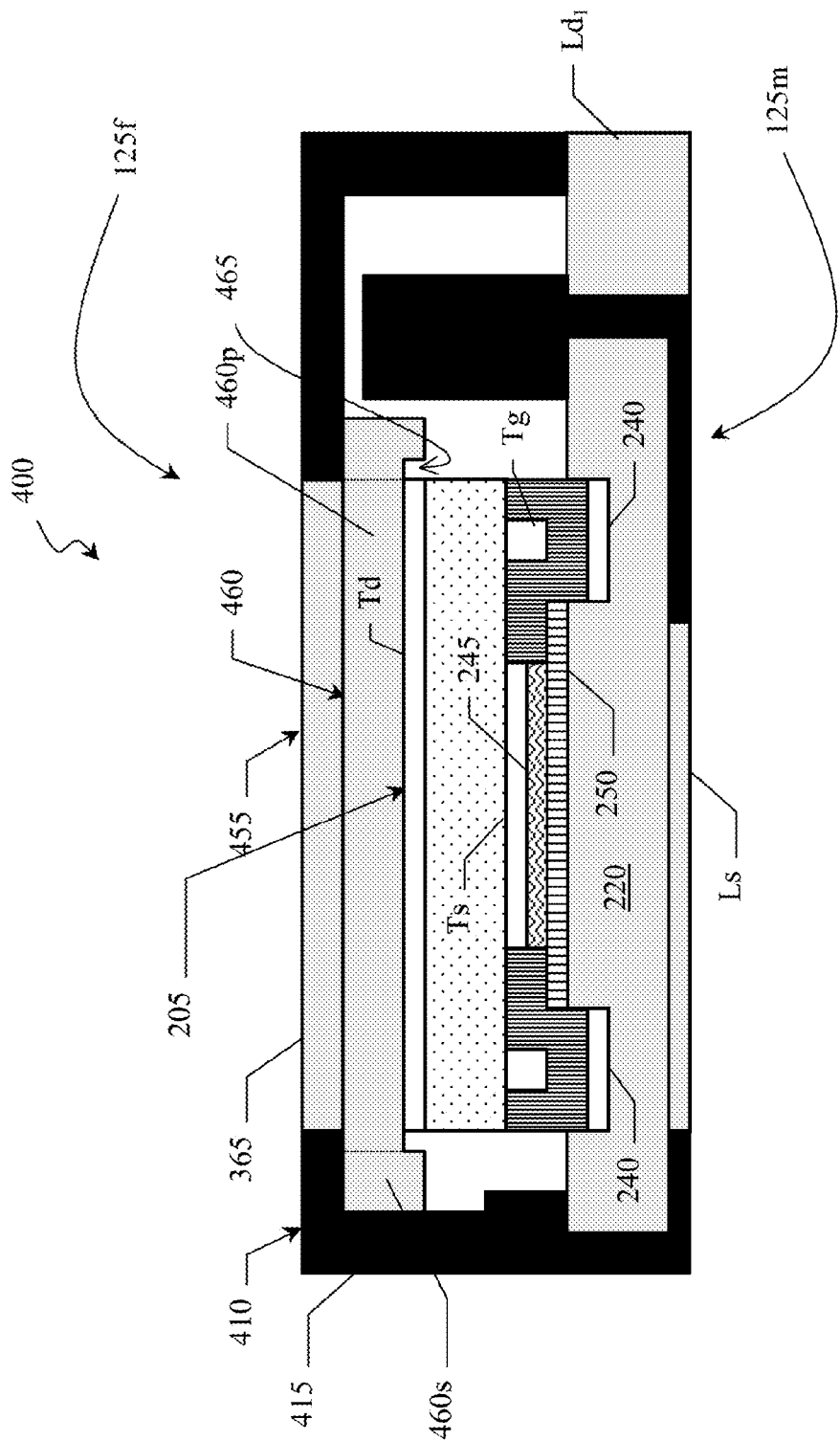
FIG. 4 shows a schematic representation of an electronic device according to a further embodiment.

With reference to FIG. 4, there is shown a sectional view of an electronic device 400 (e.g., still a power device) according to a further embodiment.

The power device 400 comprises, as before, the chip 205 and a package 410 for embedding the latter. The package 410 comprises the heat-sink 220 and a further heat-sink 455, which has the pad 365, and a plate of conductive material 460, connected (or coupled), as before, to the terminal Td.

As visible in the figure, the plate 460 is similar to the plate 360 above described, but, differently from the latter, has a hollow 465 adapted to house at least partly the chip 205 (in the exemplary but not limiting illustrated embodiment, the hollow 465, having width greater and depth lower than the chip 205, completely houses the chip 205 in width, and partly in height).

In particular, the hollow 465 defines a portion 460p having a lower thickness (on which portion rests the chip 205), and another portion 460s, adjacent to the portion 460p, having a higher thickness (and equal to the thickness of the plate 460). For example, the portion 460p has a thickness preferably between 10% and 95%, still more preferably between 20% and 90%, for example, 70% (as shown in the figure) of the thickness of the portion 460s, and depending on the depth of the hollow 465.

In this way, in phase of encapsulation of the chip 205, the heat-sink 455 will be at a lowered position (by the same depth of the hollow 465) with respect to the case of FIG. 3; in this way, the package 410 (and hence the power device 400) will have a thickness being lower by the same amount. The power device 400 is further advantageous with respect to the previous power device as it allows obtaining, with respect to the latter, a reduction of the thickness in a simple and effective way; moreover, such result is achieved by complying with the safety parameters of the power device, and without the need for structural changes such as to require a redesign of the same. In particular, the described solution allows obtaining a power device with a reduced thickness (e.g., less than 1 mm thick, or sub-millimeter power device) in a simple manner, and hence with low costs (in this respect, it should be noted that, in order to obtain such a sub-millimeter device power, the thickness reduction may affect, additionally or alternatively to the hollow made within the plate 360, the heat-sink 220, for example by forming within the latter a single cavity that houses the chip 205 at least partly).

The described solution is further advantageous as it may be used for making very high power devices that, for the same encumbrance with respect to those currently on the market, have better heat dissipation properties. In fact, in case it is desired to use a chip on which a very high power component is integrated (i.e., able to withstand operating voltages much higher than 300V, as between 600 and 1000V), the reduction of the thickness of the package (that the described solution allows obtaining) allows implementing expedients (e.g., modifying the pad 365 or providing one or more auxiliary dissipation elements on it) whose space requirement may be substantially compensated by such reduction.

Figure 5:
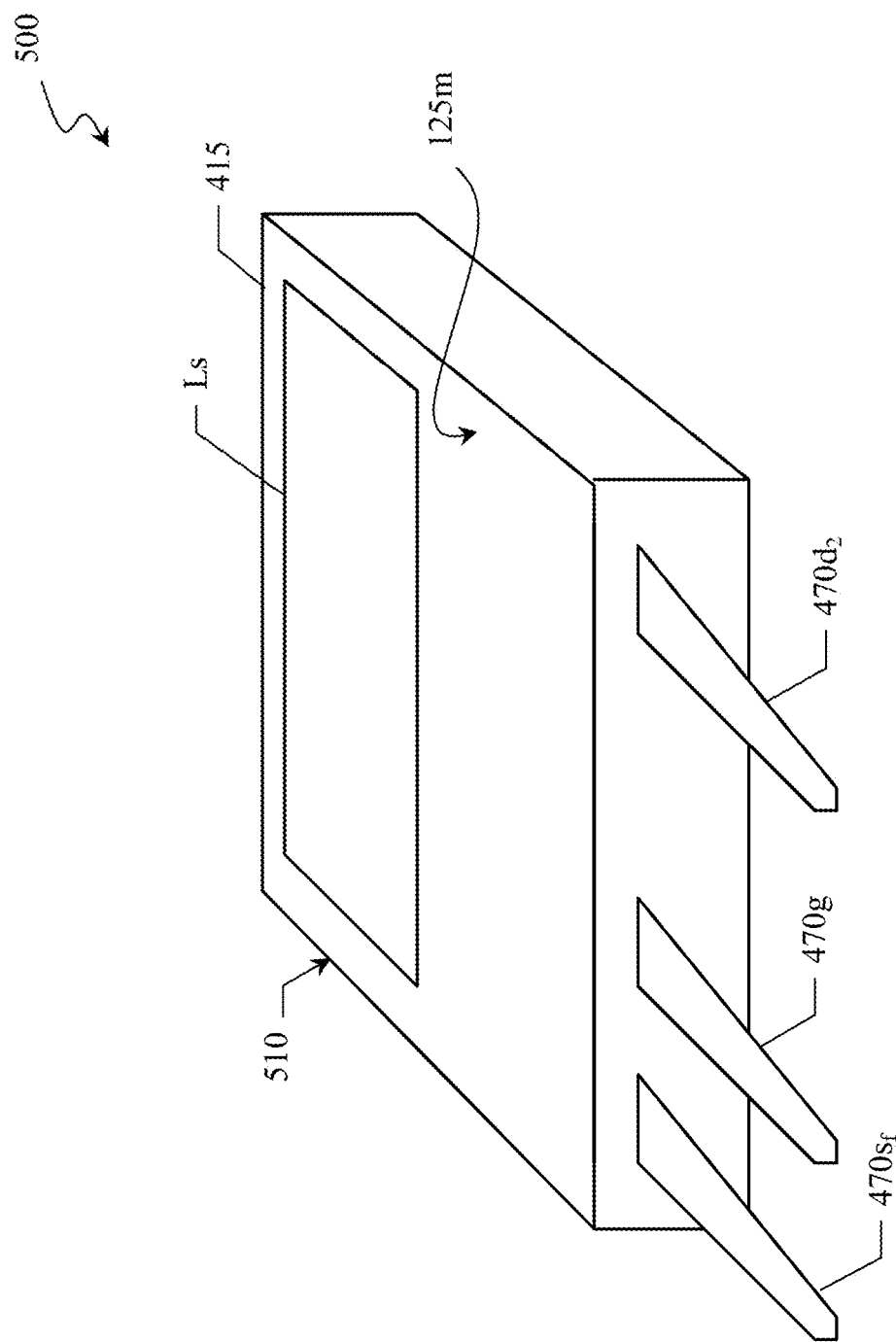
FIG. 5 shows a perspective representation of an electronic device according to a still further embodiment.

Turning now to FIG. 5, it shows a schematic representation of an electronic device 500 (e.g., still a power device) according to a still further embodiment.

The power device 500 is substantially equivalent to the previous power device, but with respect to the latter is configured for being fixed on a PCB (not shown) by through-hole technology (THT) according to a vertical orientation (i.e., orthogonal to a longitudinal plane on which the PCB lies). In this respect, the power device 500 comprises a package 510 provided with leads $470s_f$, $470g$, and $470d_2$ in the form of reophores, which are suitable to be inserted into through holes of the PCB and back-welded on it.

In order to allow the terminal Ts of the chip 205 also to be connected to the PCB by THT technology, while ensuring compliance with the creepage distances, the reophores $470s_f$, $470g$, and $470d_2$ of the power device 500 have a different configuration with respect to the corresponding leads used for mounting by SMD technology (in this way, as will be explained shortly, it is possible to introduce a source reophore). In particular, the leads $470s_f$, $470g$, $470d_2$ of the power device 500 extend from the side surface of the insulating body 415 (in the positions that, in the previous embodiment, were taken by the leads $Ld_1$, $Ld_2$ and Lg, respectively), at the mounting surface 125m. Such configuration, not limiting, allows meeting the creepage distances between the gate reophore and the drain reophore, and between the drain reophore and the source reophore.

It will be understood that the reophore $470s_f$ may be connected to the terminal Ts in various ways. For example, the reophore $470s_f$ may be directly connected to the heat-sink 220 within the package 510, such as by wire bonding or by a conductive extension (not shown) of the heat-sink 220.

As it is known, the PCB may advantageously comprise a folded portion (also not shown) on which the exposed pad Ls may be fixed for dissipating heat.

Although the power device 500 has been described as a simple variation of the power device 400, it should be clear that, although not explicitly shown, further embodiments may be provided wherein, for example, the power devices 200 and 300 also are provided with reophores for THT mounting on the PCB (and for which the same considerations discussed above apply).

Naturally, in order to satisfy local and specific requirements, a person skilled in the art may apply to the solution described above many logical and/or physical modifications and alterations. More specifically, although the present invention has been described with a certain degree of particularity with reference to preferred embodiments thereof, it should be understood that various omissions, substitutions and changes in the form and details as well as other embodiments are possible. In particular, different embodiments may even be practiced without the specific details (such as the numeric examples) set forth in the preceding description for providing a more thorough understanding thereof; on the contrary, well known features may have been omitted or simplified in order not to obscure the description with unnecessary particulars. Moreover, it is expressly intended that specific elements and/or method steps described in connection with any disclosed embodiment may be incorporated in any other embodiment as a matter of general design choice.

In particular, analogous considerations apply if the electronic device and/or the system has a different structure or comprises equivalent components. In any case, any component thereof may be separated into several elements, or two or more components may be combined into a single element; in addition, each component may be replicated for supporting the execution of the corresponding operations in parallel. It should also be noted that any interaction between different components generally does not need to be continuous (unless otherwise indicated), and it may be both direct and indirect through one or more intermediaries. For example, the electronic device may comprise different chips, within each of which any component, electronic circuit, and/or electronic module (not necessarily of the power type) may be integrated.

The illustrated shape of the insulating body is not to be construed limitatively, as well as type of materials and production process that can be used for the making thereof.

As should be clear from the above description, the term "mounting surface" generally refers to the surface intended to be mounted on any board or support; in case of package of the Fully Molded type, such mounting surface represents, both in case of SMT technology electronic devices and in case of THT technology electronic devices, the exposed surface of the heat-sink (the only one being provided). Instead, in case of package of the DSC type, wherein two exposed surfaces are provided, the mounting surface is, for the SMT technology electronic devices (and for THT technology electronic devices with package of the DIL—"Dual In-Line", Zip type and the like), the one that, in use, faces towards the PCB, or, for the vertical mounting THT technology electronic devices (such as in the case of the electronic devices with package of the TO-92, TO-220 type and the like), the one that is usually mounted on the support element able to stably maintain the electronic device in such vertical position.

Although the gate terminal has been described as extending around the source terminal, this does not exclude that this is the only possible way to make it. In this respect, the gate terminal may comprise conductive fingers, for example extending internally towards the contact area of the source terminal and kept electrically separated from it by a suitable insulating material. In such case, the lower heat-sink may comprise further hollows at the surface of the lower heat-sink facing the chip for housing at least partly such gate fingers.

In general, it is possible to provide any number of additional hollows (with respect to those shown and/or described) suitably arranged according to specific requirements to be met. For example, such additional hollows may be arranged in such a way to intersect in a substantially central position with respect to a contact area of the source terminal (i.e., the surface area of the source terminal, typically all, that, through the soldering layer and the coupling layer is intended to electrically contact the lower heat-sink); in this way, the hollows in such configuration may act as venting channels for gaseous elements possibly generated (during the production process) within the soldering layer and that typically negatively modify thermal conductivity, electrical conductivity and mechanical reliability thereof. Anyway, it will be understood that other variants in the arrangements of the hollows may be provided, all falling within the protection scope of the present invention as conceivable expedients answering to corresponding technical requirements.

Anyway, it will be understood that the principle of the present invention, with the possible proper changes, apply for any shape and size of the terminals.

Moreover, the lower heat-sink and the upper heat-sink do not need to be necessarily in direct contact with the chip.

Both the coupling layer and the soldering layer may comprise each one corresponding multi-layer structures, for example by properly combining the materials previously indicated with other that can provide better electrical and/or mechanical proprieties.

The upper heat-sink, if provided, may protrude beyond the free surface and extend beyond it thereby taking a predetermined volume. In this respect, an auxiliary heat dissipation element may be provided above the exposed pad of the upper heat-sink, or the same exposed pad can be shaped such as to achieve greater dissipation surface. As for the lower heat-sink, also the upper heat-sink may be not directly coupled with the chip. Moreover, the upper heat-sink may not form an electrical coupling with the chip; in the latter case, an electrically insulating material may be provided between the upper heat-sink and the chip, so as to allow only a heat transferring from the chip to the heat-sink by convection.

In case of more chips embedded in a same package of the same electronic device, the upper heat-sink may comprise different hollows, each one of which may house a predefined number of chip, down to one of them.

The number of leads of the package is not limiting, as well as their connections to the terminals of the chip. Within the insulating body, functionally analogous leads (for example, leads connected to the same conduction terminal, such as the drain leads of the embodiment of FIGS. 2A and 2B) may be directly connected to each other, for example by sharing a same conductive finger (in this way, in order to contact both the drain leads to the drain terminal, only one wire bonding will be necessary). Anyway, in order to obtain optimal driving, alternative and/or additional leads may be provided exclusively for the driving of the electronic device (for example, source Kelvin leads).

The connections between the leads and the corresponding terminals may be performed in various way, according to the specific applications; for example, the drain terminal may be contacted both by wire bonding (possibly using bumps), and by portions properly extended and shaped of the upper heat-sink.

The described solution is particularly, but not exclusively, advantageous for chips integrating power components. However, the principles may be applied to other electronic device wherein it is necessary to obtain low parasitic effects (and hence high switching speeds) for the same, or reduced, thickness.

In this respect, the power component has been described by way of example only; in fact, the power component may be implemented, according to the various applications, by MOSFET, IGT, IGBT, BJT or JFET transistors, and/or diodes, thyristors, power amplifiers and/or power integrated modules.

Although in the present description explicit reference to specific operating voltages of the power components has been made, these are not to be construed in a limitative way. For example, the same considerations apply to the power components that, thanks to more accurate, reliable and advanced production process, allow obtaining operating voltages even higher than the current ones (and hence exceeding 1000V).

Although in the description SMT and THT mounting techniques have been described, the electronic device may be mounted on the board (or other suitable support) by any mounting technique.

Finally, the solution according to an embodiment lends itself to be implemented through an equivalent method (by using similar steps, removing some steps being not essential, or adding further optional steps); moreover, the steps may be performed in different order, concurrently or in an interleaved way (at least partly). Moreover, the desired result may be obtained both by directly making all the required components, or by using (at least partly) components provided by third parties already with the required features (e.g., chips and heat-sinks).

What is claimed is:

1. An electronic device, comprising:
at least one chip in which at least one electronic component is integrated, said chip comprising a first conduction terminal and a control terminal on a first surface of the chip, and a second conduction terminal on a second surface opposite the first surface of the chip, wherein the control terminal comprises a peripheral portion substantially surrounding the first conduction terminal and a contact portion for electrically contacting the control terminal;
an insulating body embedding said at least one chip, the insulating body having a mounting surface for mounting on a board;
an electrically conductive heat-sink connected to said at least one chip, wherein the heat-sink comprises a cavity channel configured for alignment with the peripheral portion of the control terminal, and wherein the cavity channel includes two side walls; and at least one first conduction lead of the electronic device at the mounting surface and directly electrically connected to the heat-sink;

wherein the first surface of the chip faces the heat-sink, the first conduction terminal being electrically connected to the heat-sink and the control terminal being electrically insulated from the heat-sink.

2. The electronic device according to claim 1, further comprising:

a coupling layer formed on the first conduction terminal, a soldering layer of conductive material formed on a surface of the heat-sink facing towards the first surface of the chip, said coupling layer and said soldering layer electrically connecting the first conduction terminal to the heat-sink, and a passivation layer covering at least partially the first conduction terminal, the passivation layer electrically insulating the control terminal from the first conduction terminal and from the heat-sink.

3. The electronic device according to claim 1, further comprising:

at least one second conduction lead for accessing the second conduction terminal, said at least one second conduction lead being electrically connected to the second conduction lead within the insulating body, at least one control lead for accessing the control terminal, and a connection electrically connecting said at least one control lead to the control terminal within the insulating body.

4. The electronic device according to claim 3, wherein said at least one first conduction lead, said at least one second conduction lead and said at least one control lead each comprise an exposed pad on the mounting surface of the insulating body, said exposed pads being adapted to be fixed on conductive tracks of the board by surface mounting technology.

5. The electronic device according claim 1, wherein the at least one electronic component comprises a MOS transistor having an operating voltage between 300V and 1000V.

6. The electronic device according to claim 1, wherein the peripheral portion is a ring shape encircling the first conduction terminal, and wherein the cavity channel is configured for alignment with the encircling peripheral portion, the cavity channel filled with material insulating the control terminal from the heat-sink.

7. An electronic device, comprising:

an integrated circuit chip forming a transistor having a first conduction terminal and a control terminal on a first surface of the chip and having a second conduction terminal on a second surface of the chip opposite the first surface, wherein the control terminal comprises a peripheral portion that surrounds the first conduction terminal and a contact portion for electrically contacting the control terminal;

a first heat sink wherein a surface of said first conduction terminal is mounted to said first heat sink through a solder layer, said first heat sink including a recess configured to permit electrical access to said control terminal, said control terminal insulated from said first heat sink, wherein the first heat sink comprises a cavity channel configured for alignment with the peripheral portion of the control terminal, and wherein the cavity channel includes two side walls; and an insulating body embedding said chip, the insulating body having a first opening on a first surface exposing a surface of the first heat sink.

8. The electronic device of claim 7, wherein the first conduction terminal is a source terminal.

9. The electronic device of claim 7, wherein the peripheral portion is a ring shape encircling the first conduction terminal, and wherein the cavity channel is configured for alignment with the encircling control terminal, said cavity channel filled with material insulating the control terminal from the first heat sink.

10. The electronic device of claim 7, wherein the surface of said first conduction terminal comprises a coupling layer, and the solder layer is provided between the coupling layer and a surface of the first heat sink.

11. An electronic device, comprising:

an integrated circuit chip forming a transistor having a first conduction terminal and a control terminal on a first surface of the chip and having a second conduction terminal on a second surface of the chip opposite the first surface;

a first heat sink wherein a surface of said first conduction terminal is mounted to said first heat sink through a solder layer, said first heat sink including a recess configured to permit electrical access to said control terminal, said control terminal insulated from said first heat sink; and an insulating body embedding said chip, the insulating body having a first opening on a first surface exposing a surface of the first heat sink;

wherein the control terminal extends on the first surface and comprises a perimeter portion substantially surrounding the first conduction terminal and a contact portion for electrically contacting the control terminal, and wherein the first heat sink comprises a plate of conductive material having a cavity channel for aligning the chip at the substantially perimeter portion of the control terminal, wherein the cavity channel includes two side walls, and wherein the recess houses the contact portion of the control terminal.

12. The electronic device of claim 11, wherein the perimeter portion is a ring shape encircling the first conduction terminal, and wherein the cavity channel is configured for alignment with the encircling perimeter portion, the cavity channel filled with material insulating the control terminal from the first heat sink.

13. An electronic device, comprising:

an integrated circuit chip forming a transistor having a first conduction terminal and a control terminal on a first surface of the chip and having a second conduction terminal on a second surface of the chip opposite the first surface, wherein the control terminal has a ring shape encircling the first conduction terminal;

a first heat sink wherein a surface of said first conduction terminal is mounted to said first heat sink through a soldering layer, said first heat sink including a recess configured to permit electrical access to said control terminal, said control terminal insulated from said first heat sink, wherein the first heat sink has a perimeter cavity including two side walls configured for alignment with the encircling control terminal, the perimeter cavity filled with material insulating the control terminal from the first heat sink; and an insulating body embedding said at least one chip, the insulating body having a first opening on a first surface exposing a surface of the first heat sink.

14. The electronic device of claim 13, further comprising:

a coupling layer formed on the first conduction terminal, and the soldering layer of conductive material formed on a surface of the first heat-sink facing towards the first surface of the chip, said coupling layer and said soldering layer electrically connecting the first conduction terminal to the first heat-sink.

15. The electronic device of claim 13, further comprising at least one first conduction lead of the electronic device at the mounting surface and directly electrically connected to the first heat-sink.

16. The electronic device of claim 15, further comprising:
at least one second conduction lead for accessing the second conduction terminal, said at least one second conduction lead being electrically connected to the second conduction terminal within the insulating body,
at least one control lead for accessing the control terminal, and
a connection electrically connecting said at least one control lead to the control terminal within the insulating body.

17. The electronic device of claim 16, wherein said at least one first conduction lead, said at least one second conduction lead and said at least one control lead each comprise each one an exposed pad on the mounting surface of the insulating body, said exposed pads being adapted to be fixed on conductive tracks by surface mounting technology.

18. The electronic device of claim 13, wherein the transistor comprises a MOS transistor having an operating voltage between 300V and 1000V.

* * * * *